(12) United States Patent
Choi et al.

(10) Patent No.: US 10,498,358 B2
(45) Date of Patent: Dec. 3, 2019

(54) DATA ENCODER AND DATA ENCODING METHOD

(71) Applicants: SK hynix Inc., Icheon-si, Gyeonggi-do (KR); Seoul National University R&DB Foundation, Seoul (KR)

(72) Inventors: Jiwoong Choi, Seoul (KR); Boyeal Kim, Uiwang-si (KR); Hyun Kim, Seoul (KR); Hyuk Jae Lee, Seongnam-si (KR); Junseo Lee, Cheongju-si (KR); Changmin Kwak, Bucheon-si (KR); Youngdoo Song, Namyangju-si (KR)

(73) Assignees: SK hynix Inc., Icheon-si, Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/181,774

(22) Filed: Nov. 6, 2018

(65) Prior Publication Data

US 2019/0245554 A1 Aug. 8, 2019

(30) Foreign Application Priority Data

Feb. 5, 2018 (KR) .................. 10-2018-0013719

(51) Int. Cl.
*H03M 7/42* (2006.01)
*G06F 3/06* (2006.01)

(52) U.S. Cl.
CPC ............ *H03M 7/42* (2013.01); *G06F 3/0608* (2013.01); *G06F 3/0659* (2013.01); *G06F 3/0661* (2013.01); *G06F 3/0673* (2013.01)

(58) Field of Classification Search
CPC ...... H03M 7/42; G06F 3/0659; G06F 3/0661; G06F 3/0673; G06F 3/0608
USPC .................. 341/51, 65, 67, 79, 87, 106
See application file for complete search history.

(56) References Cited

U.S. PATENT DOCUMENTS 6,636,167 B1 * 10/2003 Acharya ................. H03M 7/40
341/65
9,509,336 B1 * 11/2016 Henry ..................... H03M 7/30

FOREIGN PATENT DOCUMENTS

KR 100667293 B1 1/2007
KR 101770477 B1 8/2017

\* cited by examiner

*Primary Examiner* — Khai M Nguyen
(74) *Attorney, Agent, or Firm* — William Park & Associates Ltd.

(57) ABSTRACT

A data encoder including a preprocessor configured to divide a data stream into a plurality of sub data blocks; a plurality of meta data generators each configured to generate meta data from one of the plurality of sub data blocks; and a plurality of data compressors each configured to compress one of the plurality of sub data blocks according to the meta data.

20 Claims, 14 Drawing Sheets

FIG. 7

<Frequency table>

| Sym. | Freq. |
|---|---|
| b | 2 |
| e | 3 |
| d | 3 |
| c | 3 |
| a | 10 |

<Bitmap>

| Sym. | a | b | c | d | e |
|---|---|---|---|---|---|
| b | 0 | 1 | 0 | 0 | 0 |
| e | 0 | 0 | 0 | 0 | 1 |
| d | 0 | 0 | 0 | 1 | 0 |
| c | 0 | 0 | 1 | 0 | 0 |
| a | 1 | 0 | 0 | 0 | 0 |

<Code table>

| Sym. | Code | Size |
|---|---|---|
| e | | |
| d | | |
| c | | |
| b | | |
| a | | |

<Frequency table>

| Sym. | Freq. |
|---|---|
| d | 3 |
| c | 3 |
| (b,e) | 5 |
| a | 10 |

<Code table>

| Sym. | Code | Size |
|---|---|---|
| e | 1 | 1 |
| d | | |
| c | | |
| b | 0 | 1 |
| a | | |

<Bitmap>

| Sym. | a | b | c | d | e |
|---|---|---|---|---|---|
| d | 0 | 0 | 0 | 1 | 0 |
| c | 0 | 0 | 1 | 0 | 0 |
| (b,e) | 0 | 1 | 0 | 0 | 1 |
| a | 1 | 0 | 0 | 0 | 0 |

<Frequency table>

| Sym. | Freq. |
|---|---|
| (b,e) | 5 |
| (d,c) | 6 |
| a | 10 |

<Code table>

| Sym. | Code | Size |
|---|---|---|
| e | 1 | 1 |
| d | 0 | 1 |
| c | 1 | 1 |
| b | 0 | 1 |
| a | | |

<Bitmap>

| Sym. | a | b | c | d | e |
|---|---|---|---|---|---|
| (b,e) | 0 | 1 | 0 | 0 | 1 |
| (d,c) | 0 | 0 | 1 | 1 | 0 |
| a | 1 | 0 | 0 | 0 | 0 |

<Frequency table>

| Sym. | Freq. |
|---|---|
| a | 10 |
| {(b,e), (d,c)} | 11 |

<Code table>

| Sym. | Code | Size |
|---|---|---|
| e | 01 | 2 |
| d | 10 | 2 |
| c | 11 | 2 |
| b | 00 | 2 |
| a | | |

<Bitmap>

| Sym. | a | b | c | d | e |
|---|---|---|---|---|---|
| a | 1 | 0 | 0 | 0 | 0 |
| {(b,e), (d,c)} | 0 | 1 | 1 | 1 | 1 |

<Frequency table>

| Sym. | Freq. |
|---|---|
| | |
| | |
| | |
| [a,{(b,e), (d,c)}] | 21 |

<Code table>

| Sym. | Code | Size |
|---|---|---|
| e | 101 | 3 |
| d | 110 | 3 |
| c | 111 | 3 |
| b | 100 | 3 |
| a | 0 | 1 |

<Bitmap>

| Sym. | a | b | c | d | e |
|---|---|---|---|---|---|
| | | | | | |
| | | | | | |
| | | | | | |
| [a,{(b,e), (d,c)}] | 1 | 1 | 1 | 1 | 1 |

DATA ENCODER AND DATA ENCODING METHOD

CROSS-REFERENCE TO RELATED APPLICATIONS

The present application claims priority under 35 U.S.C. § 119(a) to Korean Patent Application No. 10-2018-0013719, filed on Feb. 5, 2018, which is incorporated herein by reference in its entirety.

BACKGROUND

1. Technical Field

Various embodiments may generally relate to a data encoder and a data encoding method, and more particularly to a data encoder and a data encoding method.

2. Related Art

Lossless compression is a class of data compression algorithms that allow original data to be perfectly reconstructed from compressed data. Examples of lossless compression algorithms are a Lempel-Ziv (LZ) based on a dictionary structure and a Huffman coding based on a statistical method.

The dictionary-based LZ algorithm shows a very high compression ratio in data having a repetitive pattern, but otherwise the compression ratio is lowered.

Huffman coding is a lossless encoding technique that forms a tree structure according to frequencies of symbols in data and assigns codewords to the symbols according to the tree structure to compress the data.

For continuous data, which is difficult to generate a tree structure for the entire data, a block Huffman coding technique is also proposed in which the Huffman coding is applied on each block.

In the Huffman coding, the compression ratio is related to entropy of data. The more the data becomes concentrated around a certain value, the lower the entropy becomes and the higher the compression ratio becomes.

Conversely, when the data has a random pattern, the entropy increases and the compression ratio decreases.

SUMMARY

In accordance with the present teachings, a data encoder may include a preprocessor configured to divide a data stream into a plurality of sub data blocks; a plurality of meta data generators each configured to generate meta data from one of the plurality of sub data blocks; and a plurality of data compressors each configured to compress one of the plurality of sub data blocks according to the meta data.

In accordance with the present teachings, a data encoding method may include generating a frequency table including kinds of symbols and frequencies associated with the symbols; extracting two symbols having the least frequency from the frequency table; updating the frequency table with a combined symbol made from the two symbols and sums of frequencies of the two symbols; storing information on the combined symbol in a bitmap; designating one of the two symbols as a left node and the other of the two symbols as a right node; and updating a codeword of a symbol included in the left node and updating a codeword of a symbol included in the right node with reference to the bitmap.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

FIGS. 7 to 11 shows a diagram illustrating an operation of a data compressor according to an embodiment of the present disclosure.

DETAILED DESCRIPTION

The following detailed description references the accompanying figures in describing examples of embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
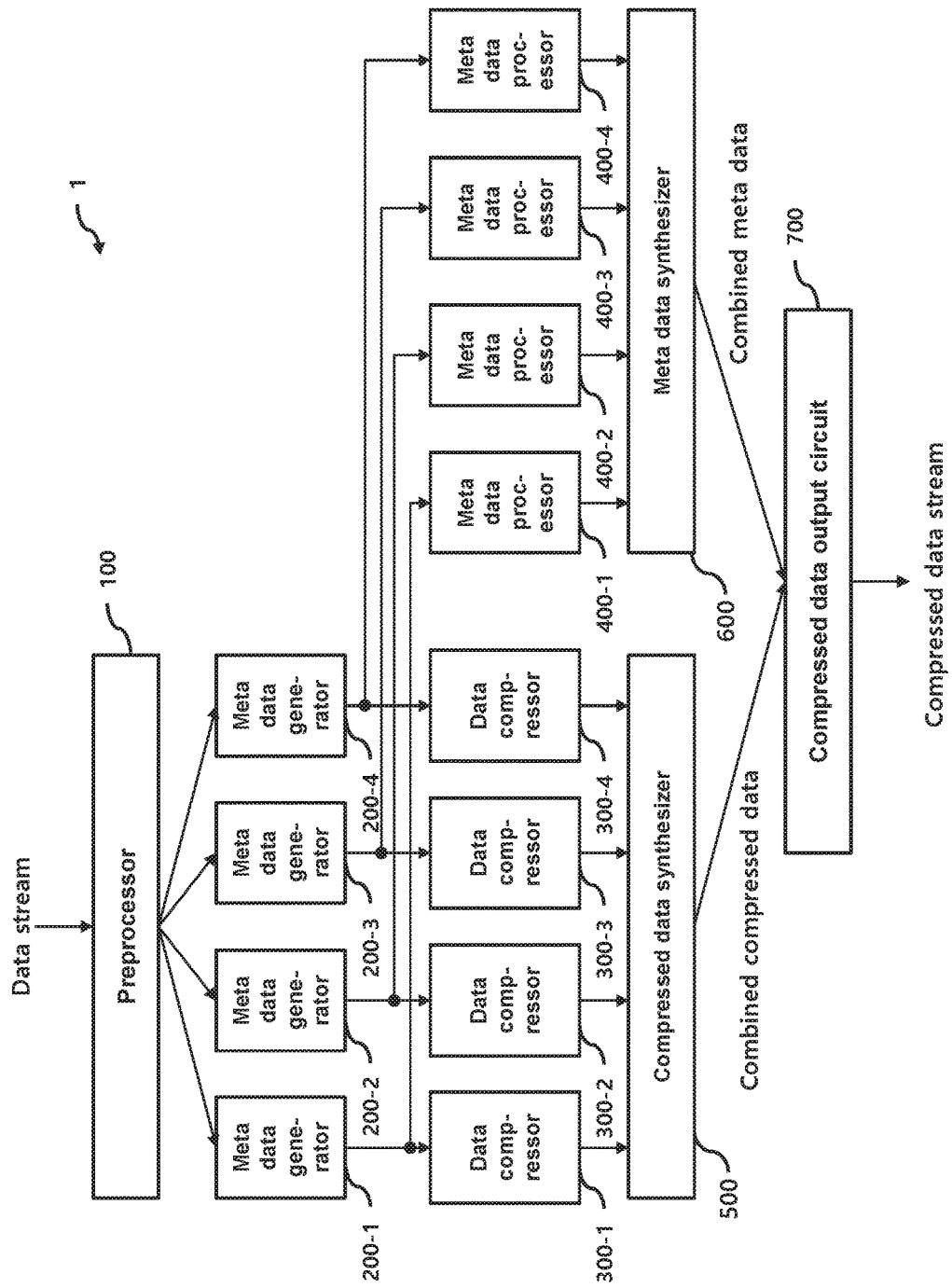
FIG. 1 shows a circuit diagram illustrating a data encoder according to an embodiment of the present disclosure.

FIG. 1 shows a block diagram illustrating a data encoder 1 according to an embodiment of the present disclosure. In some embodiments, the data encoding method used by the data encoder 1 may use a Huffman algorithm.

The data encoder 1 according to an embodiment of the present disclosure compresses a data stream and outputs a compressed data stream.

The data encoder 1 according to an embodiment of the present disclosure includes a preprocessor 100, a plurality of meta data generators 200-1 to 200-4, a plurality of data compressors 300-1 to 300-4, a plurality of meta data processors 400-1 to 400-4, a compressed data synthesizer 500, a meta data synthesizer 600, and a compressed data output circuit 700.

The preprocessor 100 divides the data stream into a plurality of sub data blocks of a predetermined size and provides the plurality of sub data blocks to the plurality of meta data generators 200-1 to 200-4.

In this case, the data stream may be a whole data or a part of the whole data having a certain size.

The preprocessor 100 may combine data having similar characteristics to form the plurality of sub data blocks and provide the plurality of sub data blocks to the plurality of meta data generators 200-1 to 200-4.

This can reduce entropy of a sub data block.

The specific configuration of the preprocessor 100 for this purpose may vary depending on types of the data.

Hereinafter, the structure of the preprocessor 100 will be described where the preprocessor 100 preprocesses input data stream such as DDR4 commands and LPDDR4 commands as examples.

Figure 2:
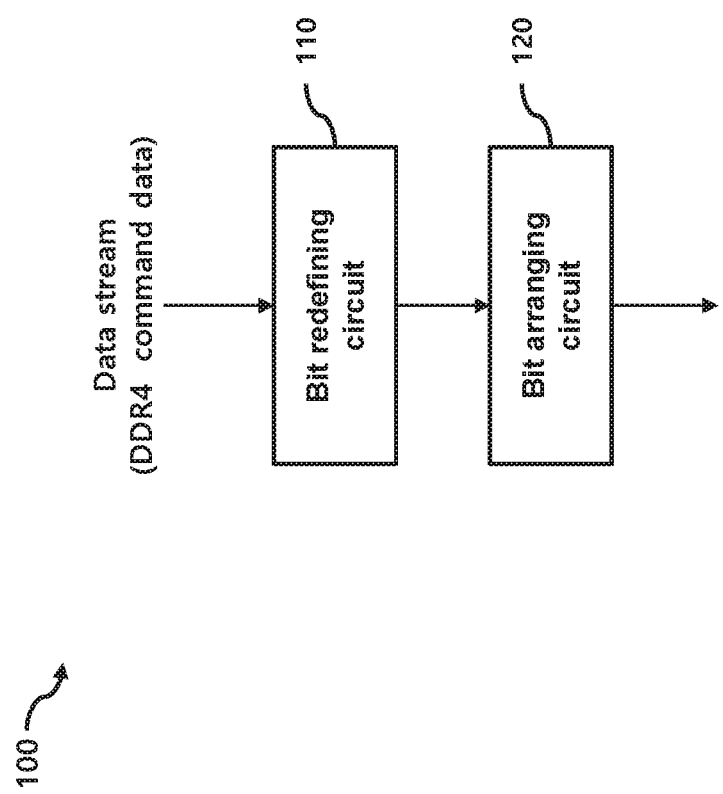
FIGS. 2 and 3 show block diagrams illustrating a preprocessor according to an embodiment of the present disclosure.

FIG. 2 shows a block diagram illustrating a preprocessor 100 according to an embodiment when DDR4 commands are provided as the data stream.

In the case of the DDR4 commands, since entropy of the data has a high value such as 0.8348, it is difficult to obtain a high compression ratio when compressing the data according to the conventional manner.

In the embodiment of FIG. 2, the preprocessor 100 includes a bit redefining circuit 110 and a bit arranging circuit 120.

The bit redefining circuit 110 redefines each don't care bit of DDR4 commands to a high level or a low level.

A DDR4 command is represented by 32 bits and contains address bits and control signal bits.

DDR4 commands include various kinds of commands, but most of them are active, read, write, precharge, or deselect commands.

The deselect command occupies relatively large portion, where CKE0, CKE1, CS0, CS1, CS2, and CS3 bits of 32 bits have the high level and the other bits correspond to don't care bits.

By designating the don't care bits as the high level or the low level, frequency of a specific symbol can be adjusted and the entropy of the sub data block can be adjusted accordingly.

The bit information of the active, read, write, and precharge commands, which occur frequently, can be used to designate don't care bits of the deselect command as the high level or the low level.

Table 1 shows the relationship between a command and the don't care bits.

TABLE 1

| | command | | | | |
|---|---|---|---|---|---|
| | /ACT bit | /RAS bit | /CAS bit | /WE bit | Other bits |
| Active | L | | Row address | | H or L |
| Read | H | H | L | H | H or L |
| Write | H | H | L | L | H or L |
| Precharge | H | L | H | L | H or L |
| Deselect | H | H | L | L | L |

As shown in Table 1, the /ACT bit and the /RAS bit of the deselect command are designated as the high level since the high level is more prevalent at the /ACT bits and the /RAS bits of the other commands and the /CAS bit and the /WE bit of the deselect command are designated as the low level since the low level is more prevalent at the /CAS bits and the /RAS bits of the other commands.

In an embodiment, the other bits except /ACT, /RAS, /CAS and /WE bits are designated as the low level since the other bits have random pattern.

The bit arranging circuit 120 arranges the bit order of the DDR4 commands so that divided sub data blocks have low entropy and divides the arranged DDR4 commands into four groups.

In an embodiment, a 32-bit command is divided into 4 groups each having 8 bits.

For this purpose, the bit arranging circuit 120 uses a correlation between bits.

If correlation information I(X,Y) represents size of data to be saved when the random data X and Y are combined, the relation information I(X, Y) may be expressed as equation 1.

$$I(X,Y)=H(X)+H(Y)-H(X,Y) \quad \text{[Equation 1]}$$

In the equation 1, H(x) represents entropy for random data X, H(Y) represents entropy for random data Y and H(X, Y) represents joint entropy of random data X and Y.

In this embodiment, correlation information is measured when any two bits are grouped in a symbol and a command is divided to 4 groups each including 8 bits according to the measurement using a clustering algorithm such as a K-medoids algorithm.

Table 2 shows an example in which 32-bit command data is divided into four groups, i.e., four symbols.

TABLE 2

| Group | bit | | | | | | | |
|---|---|---|---|---|---|---|---|---|
| 0 | A0 | A1 | A2 | A10 | A11 | A12 | A13 | /CS3 |
| 1 | A3 | A4 | A5 | A6 | A7 | A8 | A9 | A14 |
| 2 | A15 | A16 | A17 | CKE0 | CKE1 | C2 | /CS2 | /ACT |
| 3 | /CS0 | /CS1 | ODT0 | ODT1 | BA0 | BA1 | BG0 | BG1 |

Figure 3:
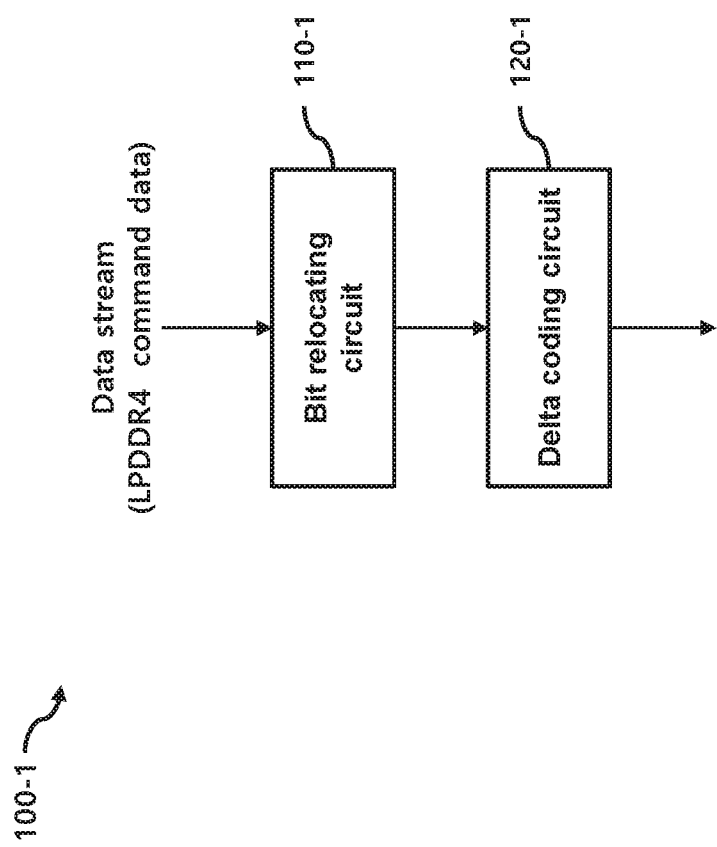

FIG. 3 shows a block diagram illustrating a preprocessor 100-1 according to an embodiment when LPDDR4 commands are provided as the data stream.

The preprocessor 100-1 divides command data so that entropy of sub data block is lowered.

In an embodiment of FIG. 3, the preprocessor 100-1 includes a bit relocating circuit 110-1 and a delta coding circuit 120-1.

Because there is similarity of data in the vertical direction when LPDDR4 commands are arranged in a matrix form, each LPDDR4 command constitutes a row.

The bit relocating circuit 110-1 performs a transpose operation which alters a row position and a column position of a matrix. In an embodiment, the data stream input to the bit relocating circuit 110-1 has a size of 32×32 bits.

In this embodiment, the delta coding circuit 120-1 performs a delta coding on the transposed data.

Delta coding is a method of expressing data using a difference between a previous symbol and a current symbol, thereby further lowering entropy.

Thereafter, the delta coding circuit 120-1 divides the delta coded data into four groups and outputs them.

In FIG. 1, each of the meta data generators 200-1 to 200-4 generate meta data by performing a data sorting operation on a corresponding sub data block.

In this case, the data sorting operation refers to an operation of identifying a type and a frequency of each symbol in the sub data block, and arranging the symbols based on the frequency.

Figure 4:
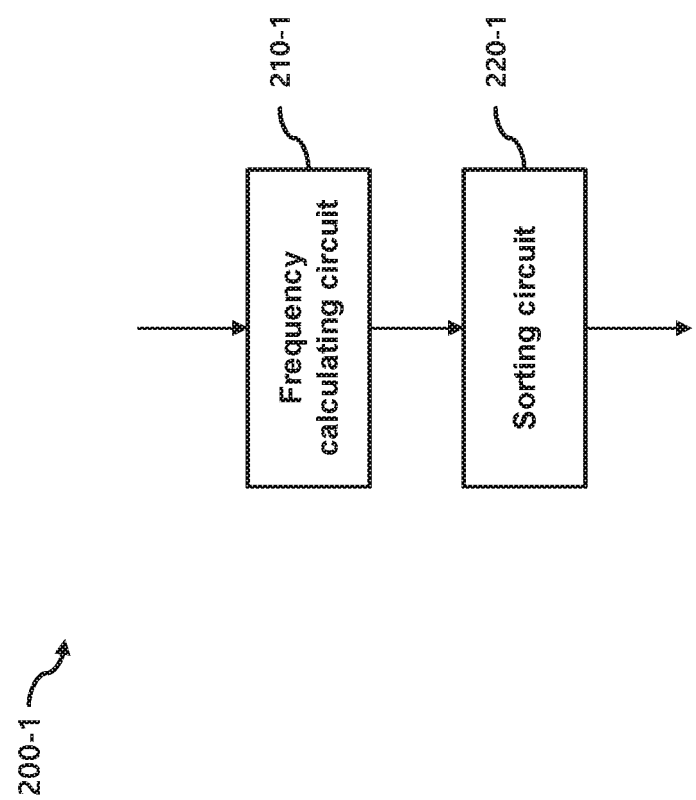
FIG. 4 shows a block diagram illustrating a meta data generator according to an embodiment of the present disclosure.

FIG. 4 shows a block diagram illustrating a meta data generator 200-1 according to an embodiment of the present disclosure.

The meta data generator 200-1 includes a frequency calculating circuit 210-1 and a sorting circuit 220-1.

The frequency calculating circuit 210-1 determines kinds of symbols included in a corresponding sub data block and frequencies of the symbols, and the sorting circuit 220-1 sorts symbols based on frequencies.

In an embodiment, 8-bit data is represented by a symbol, and a sub-data block may include 16K symbols.

Figure 5:
FIG. 5 shows a diagram illustrating an operation of a meta data generator according to an embodiment of the present disclosure.

FIG. 5 shows a diagram illustrating an operation of a meta data generator 200-1 according to an embodiment of the present disclosure.

A frequency table on the left side shows a frequency of each symbol, and a frequency table on the right side or a sorted frequency table shows symbols sorted according to frequencies of the symbols.

In an embodiment, a number of symbols and the frequency table are included in the meta data.

The meta data is included in the compressed data stream and output to be used for later decoding.

At this time, a frequency table included in the meta data may be a sorted frequency table.

The meta data generators 200-2 to 200-4 have substantially same configuration as the meta data generator 200-1, therefore descriptions thereof will be omitted.

Returning to FIG. 1, each of the meta data processors 400-1 to 400-4 combines corresponding meta data including a number of symbols and a frequency table provided from a corresponding one of meta data generators 200-1 to 200-4.

The meta data synthesizer 600 sequentially combines meta data for sub data blocks output from the meta data processors 400-1 to 400-4 to generate a combined meta data.

The data compressor 300-1 generates codewords corresponding to symbols using a frequency table output from the meta data generator 200-1, and compresses a corresponding sub data block using the generated codewords.

Figure 6:
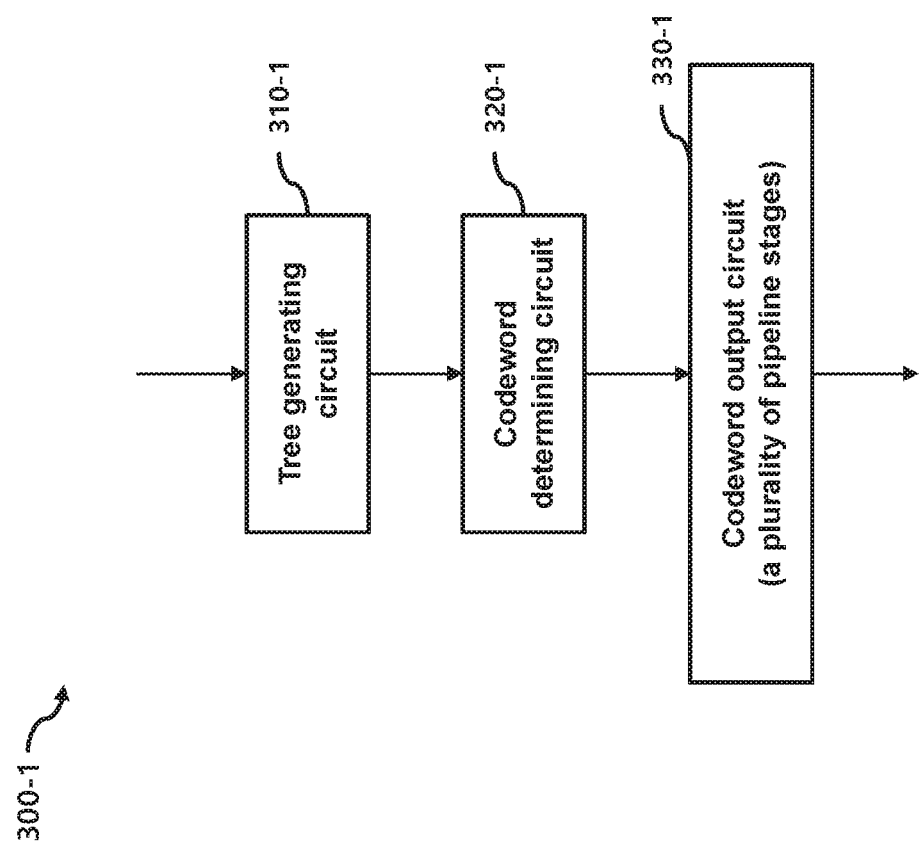
FIG. 6 shows a block diagram illustrating a data compressor according to an embodiment of the present disclosure.

FIG. 6 shows a block diagram illustrating a data compressor 300-1 according to an embodiment of the present disclosure.

The data compressor 300-1 includes a tree generating circuit 310-1, a codeword determining circuit 320-1, and a codeword output circuit 330-1. In an embodiment, the tree generating circuit 310-1 may be implemented with software, hardware, or any combination thereof. In an embodiment, the codeword determining circuit 320-1 may be implemented with software, hardware, or any combination thereof. In an embodiment, the codeword output circuit 330-1 may be implemented with software, hardware, or any combination thereof.

The tree generating circuit 310-1 forms a tree structure using a frequency table. For this, the tree generating circuit 310-1 may use a bitmap.

As shown in FIG. 7, the bitmap allows symbols connected to a node of a tree to be easily identified during a process for generating the tree structure. This will be described below.

The codeword determining circuit 320-1 determines a codeword corresponding to each symbol using the tree structure.

The tree generating circuit 310-1 and the codeword determining circuit 320-1 may operate in parallel to complete the tree structure and to determine the codeword.

The codeword output circuit 330-1 converts symbols included in a sub data block into codewords and outputs the codewords as a compressed sub data block.

For example, if the sub data block includes a large number of symbols (for example, 16K), the codeword output circuit 330-1 may be formed to have a plurality of pipeline stages to increase throughput.

For example, by converting 8 symbols at a pipeline stage for each sub data block into 8 codewords, and by performing this operation 2K times, the entire sub data block can be converted into codewords.

FIGS. 7 to 11 show a diagram illustrating an operation of a data compressor 300-1 according to an embodiment of the present disclosure.

FIG. 7 shows a frequency table, a bitmap, and a code table at an initial stage.

In the bitmap, symbols are arranged according to an ascending order of frequency in the vertical axis, and symbols are arranged in an alphabetical order on the horizontal axis.

In the bitmap, "1" is assigned at a position where same symbols intersect and "0" is assigned at a position where different symbols intersect.

The frequency table, the bitmap, and the code table can be updated as a tree structure is being formed.

First, two symbols with the least frequency are selected and extracted from the frequency table.

In FIG. 7, symbols b and e are selected.

One of the two selected symbols become a left node and the other becomes a right node, where the left node and the right node share a common parent node in the tree structure.

A combined symbol of two symbols b and e expressed as (b,e) is inserted in the frequency table. A frequency of the combined symbol (b, e) becomes 5 which corresponds to sum of frequencies of the symbols b and e.

Figure 8:
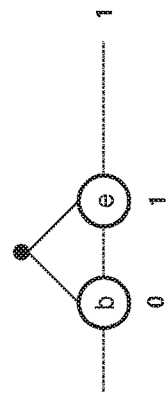

As a result, the frequency table, the bitmap, and the code table are updated as shown in FIG. 8.

It is easy to know that symbols b and e are combined under a parent node through the bitmap.

In the embodiment, a symbol at upper row of the frequency table is assigned to the left node, and a symbol at lower row of the frequency table is assigned to the right node.

Code "0" is assigned to the symbol b corresponding to the left node, and code "1" is assigned to the symbol e corresponding to the right node at the code table.

The upper right graph of FIG. 8 shows a current tree structure.

Next, two symbols d and c with the least frequency are selected and extracted from the frequency table in FIG. 8.

One of the two selected symbols become a left node and the other becomes a right node, where the left node and the right node share a common parent node.

Figure 9:
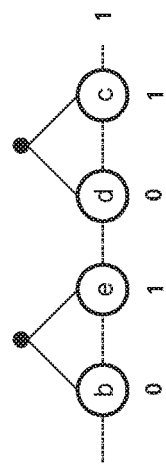

A combined symbol of two symbols d and c expressed as (d, c) is inserted in the frequency table (FIG. 9). A frequency of the combined symbol (d, c) becomes 6 which corresponds to sum of frequencies of the symbols d and c.

Accordingly, the frequency table, the bitmap, and the code table are updated as shown in FIG. 9.

The bitmap indicates that symbol d and the symbol c are combined under a parent node.

In the embodiment, a symbol at upper row of the frequency table is assigned to the left node, and a symbol at lower row of the frequency table is assigned to the right node.

Code "0" is assigned to the symbol d corresponding to the left node, and code "1" is assigned to the symbol c corresponding to the right node at the code table.

The symbol above the frequency table is assigned to the left node and the symbol below the frequency table is assigned to the right node.

Code "0" is assigned to the symbol d corresponding to the left node and code "1." is assigned to the symbol c corresponding to the right node.

Next, two symbols (b,e) and (d,c) with the least frequency are selected and extracted from the frequency table in FIG. 9.

One of the two selected symbols becomes a left node and the other becomes a right node, where the left node and the right node share a common parent node.

A combined symbol of two symbols (b,e) and (d,c) expressed as {(b,e),(d,c)} is inserted in the frequency table. A frequency of the combined symbol {(b,e),(d,c)} becomes 11 which corresponds to sum of frequencies of the symbols (b,e) and (d,c).

Figure 10:
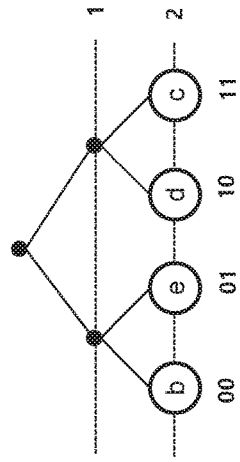

Accordingly, the frequency table, the bitmap, and the code table are updated as shown in FIG. 10.

The bitmap indicates that symbol (b,e) and the symbol (d,c) are combined under a parent node.

In the embodiment, a symbol at upper row of the frequency table is assigned to the left node, and a symbol at lower row of the frequency table is assigned to the right node.

Code "0" is added to the symbol (b,e) corresponding to the left node, and code "1" is added to the symbol (d,c) corresponding to the right node at the code table.

That is code "0" is added to an upper bit of a code corresponding to the symbols b and e and code "1" is added to an upper bit of a code corresponding to the symbols d and c.

Next, two symbols a, {(b,e),(d,c)} with the least frequency are selected and extracted from the frequency table in FIG. 10.

One of the two selected symbols become a left node and the other becomes a right node, where the left node and the right node share a common parent node.

A combined symbol of two symbols a and {(b,e),(d,c)} expressed as [a,{(b,e),(d,c)}] is inserted in the frequency table. A frequency of the combined symbol [a,{(b,e),(d,c)}] becomes 21 which corresponds to sum of frequencies of the symbols a and {(b,e),(d,c)}.

Figure 11:
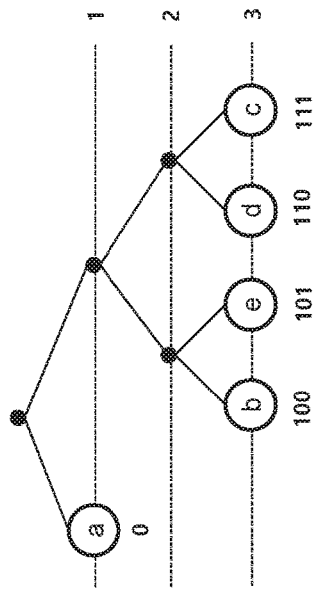

Accordingly, the frequency table, the bitmap, and the code table are updated as shown in FIG. 11.

The bitmap indicates that symbol a and the symbol {(b,e),(d,c)} are combined under a parent node.

In the embodiment, a symbol at upper row of the frequency table is assigned to the left node, and a symbol at lower row of the frequency table is assigned to the right node.

Code "0" is added to the symbol a corresponding to the left node, and code "1" is added to the symbol {(b,e),(d,c)} corresponding to the right node at the code table.

That is code "0" is assigned as a code corresponding to the symbols a and code "1" is added to an upper bit of a code corresponding to the symbols b, e, d and c.

Since there are just one symbol in the frequency table, it is assumed that the tree structure is completely generated.

If the tree structure and the code table is completed as in FIG. 11, a codeword of each symbol may be determined.

In FIG. 6, the codeword output circuit 330-1 converts symbols included in a sub data block into codewords using codewords determined for symbols and outputs the codewords as a compressed sub data block.

The compressed data synthesizer 500 combines codewords for each sub data block and outputs combined compressed data.

In an embodiment, the codeword output circuit 330-1 may convert entire sub data block into codewords in a row.

Accordingly, if compressed data output from the data compressors 300-1 to 300-4 are C1, C2, C3, and C4, the compressed data synthesizer 500 can sequentially output the compressed data.

In another embodiment, the codeword output circuit 330-1 may operate in a pipelined manner.

For example, the codeword output circuit 330-1 may perform an operation of converting 8 symbols into codewords N (=2K) times to compress a sub data block.

Accordingly, the compressed data synthesizer 500 can output data like C11, C21, C31, C41, . . . , C1N, C2N, C3N, and C4N.

At this time, each of C1x, C2x, C3x, and C4x (x=1, 2, . . . , N) represent eight codewords output from a corresponding one of the data compressors 300-1 to 300-4.

The compressed data output circuit 700 outputs the compressed data stream including the combined compressed data output from the compressed data synthesizer 500 and the combined meta data output from the meta data synthesizer 600.

The combined meta data may precede the combined compressed data in the compressed data stream.

Figure 12:
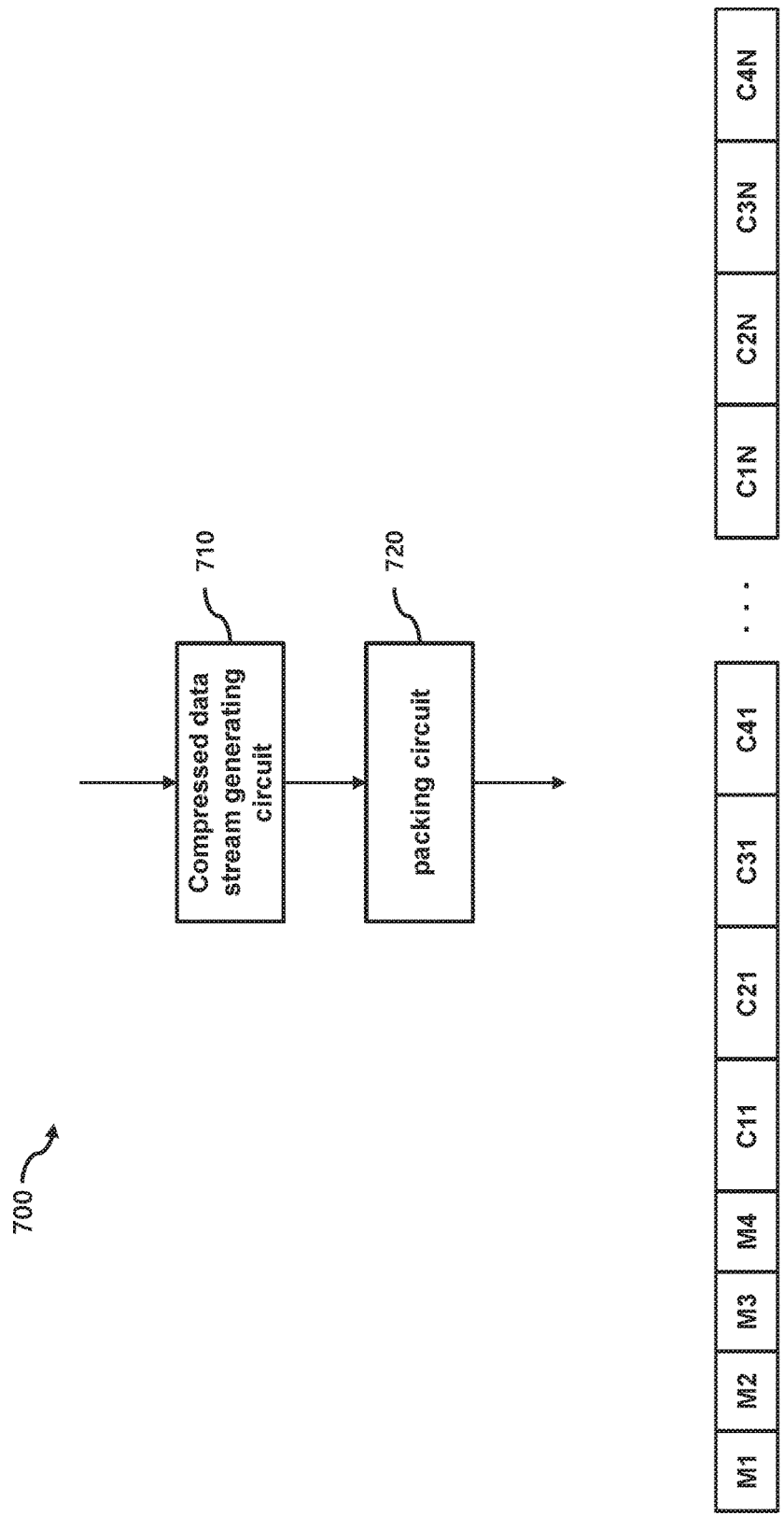
FIG. 12 shows a block diagram illustrating a compressed data output circuit according to an embodiment of the present disclosure.

FIG. 12 shows a block diagram illustrating a compressed data output circuit 700 according to an embodiment of the present disclosure.

In an embodiment, the compressed data output circuit 700 includes a compressed data stream generating circuit 710 and a packing circuit 720.

The compressed data stream generating circuit 710 generates a compressed data stream by combining the combined meta data M1, M2, M3, and M4 and the combined compressed data C11 to C4N.

The packing circuit 720 packs the compressed data stream by a predetermined number of output bits and outputs the packed data stream.

Figure 13:
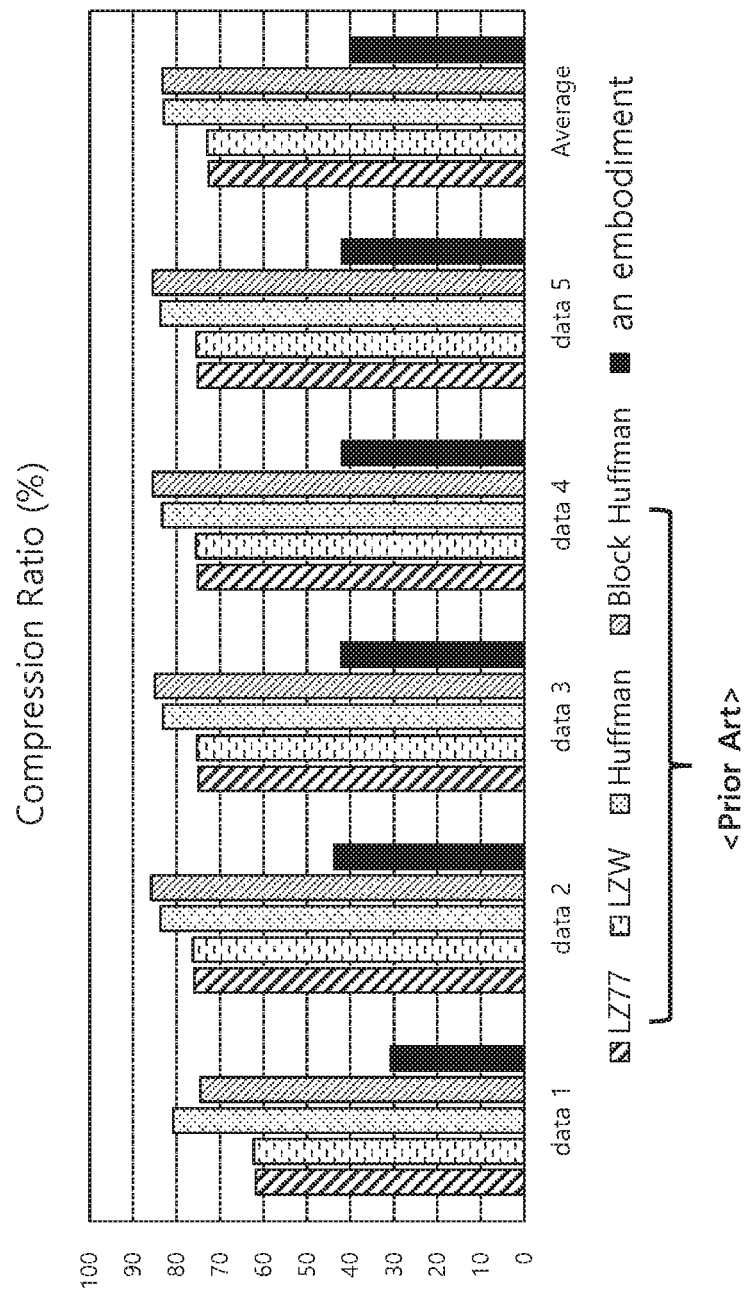
FIGS. 13 and 14 show graphs illustrating an efficiency of a data encoder according to an embodiment of the present disclosure.
Figure 14:
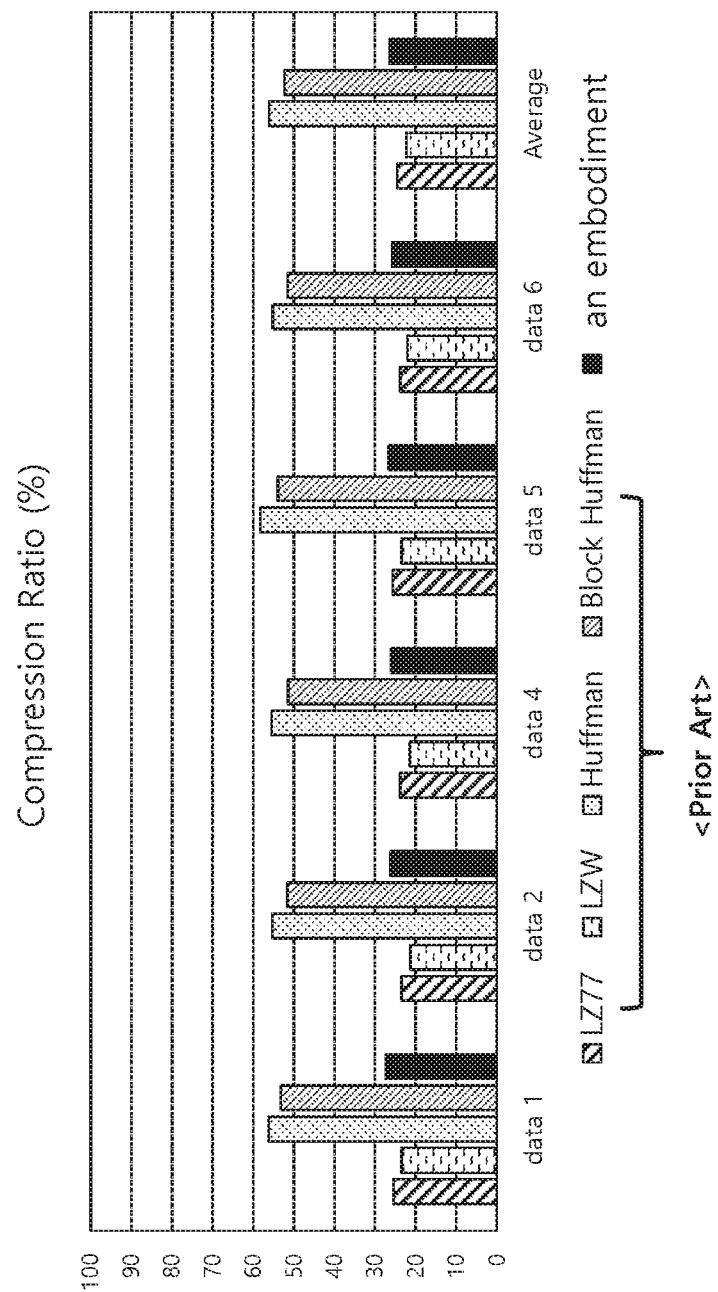

FIGS. 13 and 14 show graphs illustrating an efficiency of a data encoder according to an embodiment of the present disclosure.

FIG. 13 shows a comparison of compression ratios for DDR4 command data stream.

In this case, the compression ratio is a value obtained by dividing size of data after compression by size of data before compression, which is expressed in percent.

DDR4 command data stream has a random pattern. Accordingly, as shown in FIG. 13, LZ77 algorithm has an average compression ratio of 72.59%, LZW algorithm has an average compression ratio of 72.97%, Huffman coding has 82.93%, and Block Huffman coding has an average compression ratio of 83.29%, which show inefficient compression performance.

In contrast, when an encoder according to a present disclosure is used, the compression ratio is 40.13% on average, which shows a great improvement from the prior arts.

FIG. 14 shows compression performance of LPDDR4 command data stream.

In case of LPDDR4 command data stream, there are relatively many repetitive patterns, so dictionary-based compression algorithms such as LZ77 and LZW show good compression performance.

In FIG. 14, LZ77 shows an average compression ratio of 24.45% and LZW shows an average compression ratio of 22.34%.

On the other hand, Huffman coding shows an average compression ratio of 56.09% and Block Huffman coding shows an average compression ratio of 52.31%, which is not as good as LZ77 or LZW.

On the other hand, a data encoder according to the present disclosure shows a high compression ratio of 26.4% on average.

As described above, a data encoder according to the present disclosure has an advantage of excellent compression performance in both data stream having a random pattern and data stream having a repetitive pattern.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A data encoder comprising:
a preprocessor configured to divide a data stream into a plurality of sub data blocks;
a plurality of meta data generators each configured to generate meta data from one of the plurality of sub data blocks; and
a plurality of data compressors each configured to compress one of the plurality of sub data blocks according to the meta data.

2. The data encoder of claim 1, wherein the preprocessor divides the data stream into the plurality of sub data blocks according to entropy of each of the plurality of sub data blocks.

3. The data encoder of claim 2, wherein the data stream includes a memory command and the preprocessor redefines don't care bits of the memory command into a high level or a low level, arranges bits of the memory command and divides the memory command into a plurality of groups.

4. The data encoder of claim 2, wherein the data stream includes a plurality of memory commands each comprised in a row of a matrix and the preprocessor performs a transpose operation on the matrix and divides the matrix by the row into a plurality of groups.

5. The data encoder of claim 4, wherein the preprocessor further performs a delta coding after performing the transpose operation.

6. The data encoder of claim 1, wherein each of the meta data generators generates a frequency table storing kinds of symbols included in a sub data block and frequencies of the symbols and generates meta data corresponding to the sub data block.

7. The data encoder of claim 6, wherein the meta data includes the kinds of the symbols and a frequency table storing the symbols sorted by frequencies of the symbols.

8. The data encoder of claim 6, wherein each of the plurality of data compressors comprises:
a tree generating circuit configured to generate a tree structure including nodes corresponding to the symbols stored in the frequency table;
a codeword determining circuit configured to determine codewords corresponding to the symbols; and
a codeword output circuit configured to compress the sub data block according to the codewords.

9. The data encoder of claim 8, wherein the tree generating circuit extracts two symbols with least frequency and inserts a combined symbol made from the two symbols and having a frequency corresponding to sum of frequencies of the two symbols in the frequency table.

10. The data encoder of claim 9, wherein the codeword determining circuit designate one of the two symbols as a left node and the other of the two symbols as a right node and updates a codeword of a symbol included in the left node or the right node.

11. The data encoder of claim 10, wherein the codeword determining circuit adds a high level bit to update a codeword of a symbol include in the left node and adds a low level bit to update a codeword of a symbol included in the right node.

12. The data encoder of claim 9, wherein the tree generating circuit generates a bitmap indicating whether the two symbols are extracted and the codeword determining circuit identifies the two symbols with reference to the bitmap.

13. The data encoder of claim 8, wherein the codeword output circuit includes a plurality of pipeline stages.

14. The data encoder of claim 1, further comprising:
a compressed data output circuit configured to output a compressed data stream with an output from the plurality of meta data generators and an output from the plurality of data compressors,
wherein the compressed data output circuit includes a compressed data stream generating circuit generating a compressed data stream including a series of a plurality of meta data corresponding to the plurality of sub data blocks and a series of compressed data corresponding to the plurality of sub data blocks.

15. The data encoder of claim 14, wherein the compressed data output circuit further comprises a packing circuit for packing the compressed data stream by a predetermined number of bits.

16. The data encoder of claim 1, further comprising a compressed data synthesizer configured to combine a plurality of outputs from the plurality of data compressors.

17. The data encoder of claim 1, further comprising a meta data synthesizer configured to combine a plurality of outputs from the plurality of meta data generators.

18. The data encoder of claim 17, further comprising a plurality of meta data processors each configured to combine meta data output from corresponding one of the plurality of meta data generators.

19. A data encoding method comprising:
generating a frequency table comprising symbols and frequencies associated with the symbols;
extracting two symbols having the least frequency from the frequency table;
updating the frequency table with a combined symbol made from the two symbols and sums of frequencies of the two symbols;
storing information on the combined symbol in a bitmap;
designating one of the two symbols as a left node and the other of the two symbols as a right node; and
updating a codeword of a symbol included in the left node and updating a codeword of a symbol included in the right node with reference to the bitmap.

20. The data encoding method of claim 19, wherein the updating a codeword of a symbol in the left node includes adding a high level bit and the updating a codeword of a symbol in the right node includes adding a low level bit.

* * * * *